United States Patent [19]

Romano' et al.

[11] Patent Number: 5,653,020

[45] Date of Patent: Aug. 5, 1997

[54] METHOD FOR FORMING PLASTIC PACKAGES, IN PARTICULAR THIN PACKAGES, FOR SEMICONDUCTOR ELECTRONIC DEVICES

[75] Inventors: Luigi Romano', Monza; Fulvio Tondelli, Milan, both of Italy

[73] Assignee: SGS-Thomson Microelectronics, S.r.l., Italy

[21] Appl. No.: 550,032

[22] Filed: Oct. 30, 1995

Related U.S. Application Data

[62] Division of Ser. No. 431,312, Apr. 28, 1995.

[30] Foreign Application Priority Data

Sep. 30, 1994 [EP] European Pat. Off. ............ 94830469.6

[51] Int. Cl.$^6$ ................................................ H01R 43/00
[52] U.S. Cl. .................... 29/856; 29/827; 29/841; 264/272.17; 257/787; 438/106
[58] Field of Search ...................... 29/827, 856, DIG. 29, 29/841, 848; 437/211, 217, 220; 257/787, 788, 730; 264/272.17

[56] References Cited

U.S. PATENT DOCUMENTS

| | | | |
|---|---|---|---|
| 2,942,302 | 6/1960 | Beyer | 29/856 X |
| 4,330,790 | 5/1982 | Burns | 29/827 X |
| 4,944,908 | 7/1990 | Levegne et al. | 264/272.17 X |
| 5,071,612 | 12/1991 | Obara | 264/272.17 X |
| 5,492,866 | 2/1996 | Nishikawa | 437/207 |

FOREIGN PATENT DOCUMENTS

| | | | |
|---|---|---|---|
| 638145 | 9/1960 | Italy | 264/272.17 |

*Primary Examiner*—Peter Vo
*Assistant Examiner*—Khan Nguyen
*Attorney, Agent, or Firm*—Felsman, Bradley, Gunter & Dillon, LLP

[57] ABSTRACT

The invention relates to a method for forming a plastic package for an integrated electronic semiconductor device to be encapsulated within a plastic body, being of the type which comprises the step of molding said plastic body so as to fully enclose a semiconductor element, on which an integrated electronic circuit has been formed and which is placed onto a metal leadframe connected electrically to said integrated electronic circuit and carrying a plurality of terminal leads for external electric connection. To compensate the outward bends uncontrollably undergone by the plastic body due to thermal stresses during the molding step, a mold is used which has a cavity delimited by perimeter walls which define a concave-shaped volume. Preferably, at least one of the large walls, a bottom wall and a top wall, has a curvature inwardly of said mold cavity. The curvature values are predetermined to compensate any outward curvature undergone by corresponding surfaces of said plastic body during the molding step. The plastic package thus obtained exhibits, at the end of the molding step, a body having a diversified thickness which is at a maximum near the edges and at a minimum in the central portion; the difference between these thicknesses is proportional to the amount of the relative deformation undergone by the central regions of the body surfaces with respect to the regions near the edges. The plastic body is within ideal overall dimensions.

13 Claims, 4 Drawing Sheets

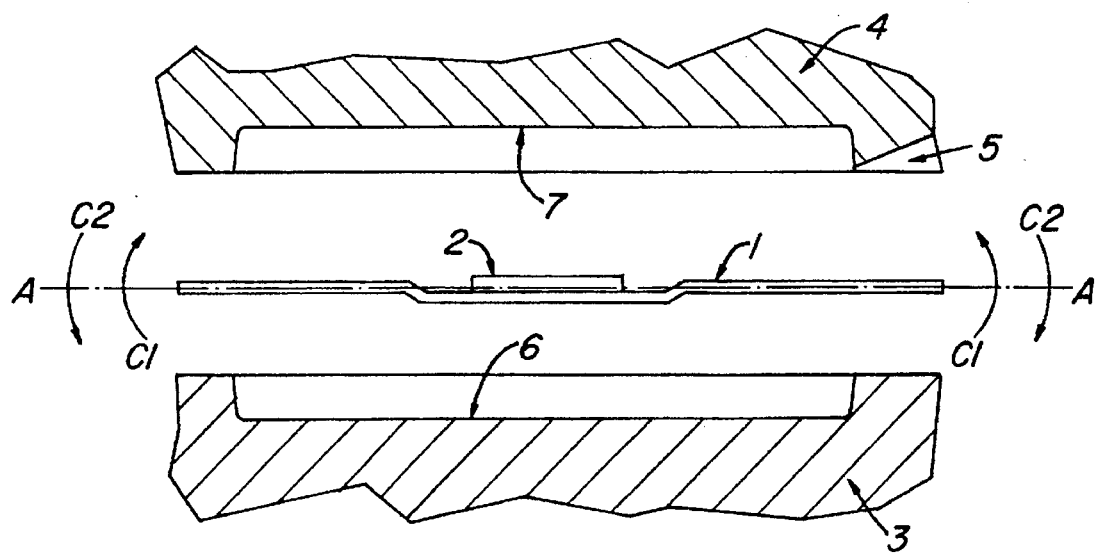
(PRIOR ART) Fig. 1
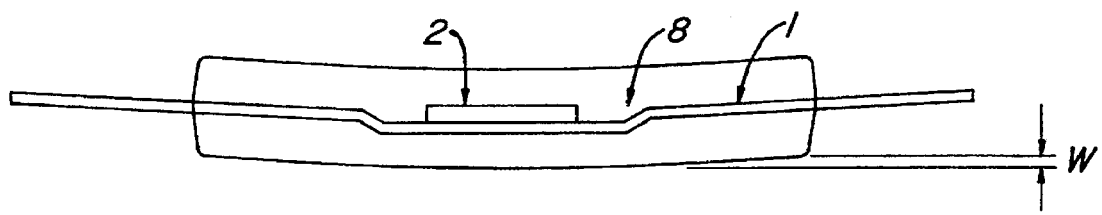
(PRIOR ART) Fig. 2
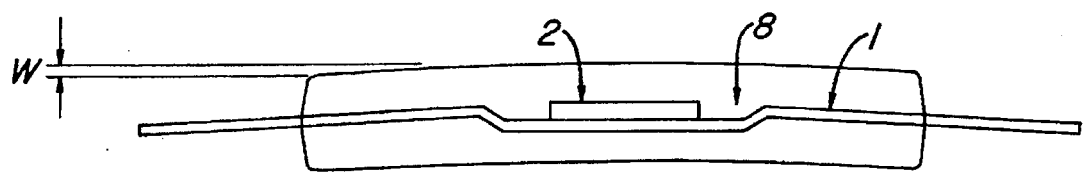
(PRIOR ART) Fig. 3

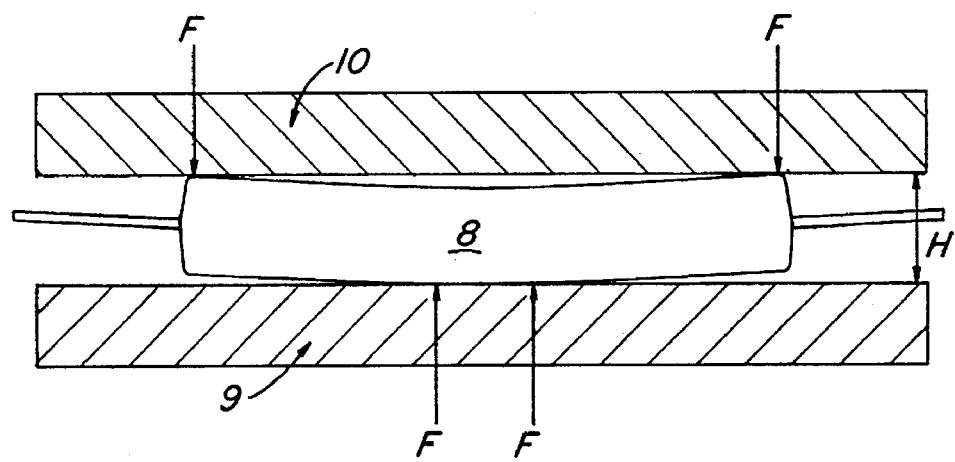
(PRIOR ART) Fig. 4
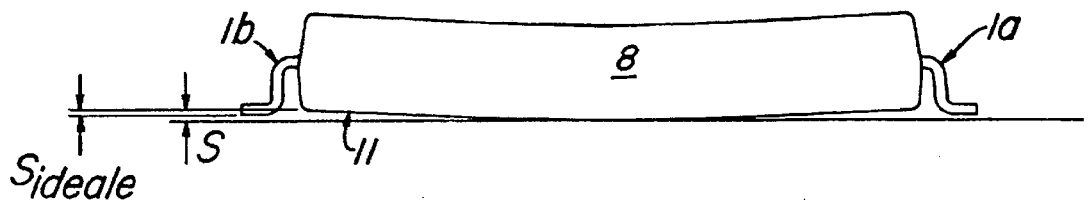
(PRIOR ART) Fig. 5
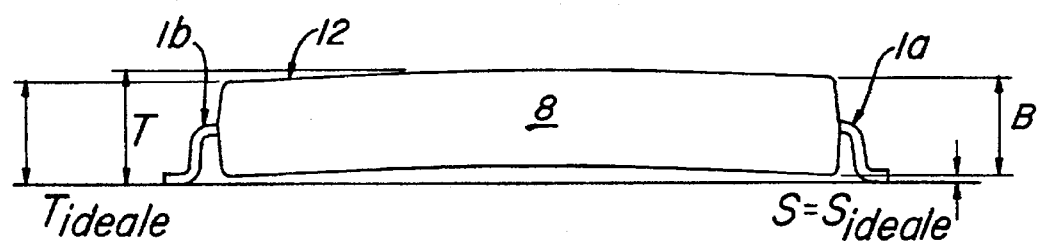
(PRIOR ART) Fig. 6

METHOD FOR FORMING PLASTIC PACKAGES, IN PARTICULAR THIN PACKAGES, FOR SEMICONDUCTOR ELECTRONIC DEVICES

This is a Division of application Ser. No. 08/431,312, filed Apr. 28, 1995.

BACKGROUND OF THE INVENTION

1. Field of the Invention

This invention relates to an improved method for forming plastic packages for electronic semiconductor devices, which is particularly useful in the instance of thin packages including a supporting and electric connection metal frame and a plastic body. The invention also relates to a package with improved characteristics. The invention is specifically directed to the use of a mold of improved shape for forming the plastic casing.

2. Description of the Prior Art

As is well known, integrated electronic semiconductor devices, comprising an integrated circuit, are formed on so-called "dies" of a semiconductor maternal which are mounted integrally to electric interconnection structures enclosed in a body of a synthetic plastic material serving a protective function.

In the specific field of this invention, such structures typically comprise a support, usually a thin metal foil (leadframe), the central portion whereof, usually depressed, accommodates the die, and which has terminal leads. The die is, across one of its large surfaces, in contact with the leadframe, the integrated circuit being exposed on the opposite die surface in electric contact with the leads. A plastic body fully encloses the integrated device, and in part the leadframe on which this is mounted. The terminal parts of the leads, or pins, are located on the body exterior and function as electric connections for connecting the device to an external circuit.

Within the scope of this invention, of special concern are reduced-thickness packages, having body length and width which are much greater than its thickness. These are commonly referred to as thin packages, and are supplied to the field in different types and for different applications. Usually, they are employed for devices which require no large power loss, that is, devices which are designed for operating on comparatively small currents. For a better understanding of the aspects of this invention, it pays to briefly review the usual steps of a conventional package forming process.

Typically, the dies are first placed on a certain number of leadframes formed on a single metal strip, and the electric connections to the leads are established using thin metal wires. The strip carrying the dies is then introduced into a mold having cavities corresponding to the individual devices, and a molten, electrically insulating material is injected at a high temperature to form the monolithic plastic body of the package. This material is usually a synthetic resin, such as an epoxy resin. The molding step includes a number of stages at which the temperature is gradually changed to avoid any risks of breaking the semiconductor material or, in any case, reducing the device reliability. On this account, moreover, the leadframe is heated before the molten material is poured in. After injecting the resin, that is after the molding in the proper sense of the word, and following a first cooling step with consequent partial polymerization, the resin is subjected to thermodynamic curing processes. The latter will improve the material properties by promoting thorough polymerization and stretching the long molecules which compose the polymeric material of the resin. The batch of packages thus formed is then taken out of the mold.

A known mold for injecting the resin is depicted in FIG. 1, which shows an exploded vertical section view taken through a single cavity, i.e. a single package, of the batch. A leadframe 1 having a semiconductor die mounted thereon is placed into the mold cavity with the ends of the terminal leads protruding outside the cavity. The mold comprises, in the embodiment shown, two parts: a lower half-mold or half-shell die 3 and an upper half-mold or half-shell 4, each having a corresponding hollow therein. The two half molds are disposed with their hollows facing each other to define a cavity whereinto the resin is then injected through an inlet port 5 formed in the mold itself.

In accordance with the prior art, the large parametric walls delimiting the cavity (bottom wall 6 and top wall 7) are made flat in order to ideally produce a body having flat parallel top and bottom surfaces. Actually, despite the precautions taken to avoid exposure of the whole device to abrupt temperature changes brought about by the aforementioned thermal treatments, the package leaves the molding and drawing steps with a bending or so-called warpage deformation in it. The large surfaces of the resultant body are not flat, but with the central region of each surface that is sunk below or raised above the plane described by the corresponding edges.

This behavior is due to the fact that the different materials which make up the complete structure of the package, i.e. the metal leadframe, the semiconductor die, and the resin, have different thermal properties (different expansion and shrinkage coefficients). In addition, the asymmetrical distribution about the horizontal axis A—A, as shown in FIG. 1, of the materials, i.e. the leadframe 1 and the semiconductor die 2, inside the package body, generates internal stresses which contribute toward a warped package.

In other words, the ideal plane containing the leadframe—represented in section by the axis A—A—is subjected to compression in one of the directions shown by the arrows C1 and C2 in FIG. 1. This compression causes a deflection to occur in said plane, and hence in the body as a whole. The actual shape of the package at room temperature is that shown in FIGS. 2 and 3, which are sectional views taken along either of the large dimensions of the package (vertical sections). The amount of the deformation undergone has been exaggerated in the drawing figures for clarity. Viewed in cross-section, the body outline is basically that of a parallelogram with two long sides showing a concavity in the same direction.

Shown in FIG. 2 is a package with a concavity upwards, whereas in FIG. 3 the package has a concavity downwards. The direction of the bending is individual to each package and not fully predictable, although a deformation of the kind shown in FIG. 2 is more likely to occur with an internal structure of the package having the distribution of the materials shown in the figures.

As shown in both FIGS. 2 and 3, the device as a whole, i.e. both the leadframe 1 (together with the semiconductor die 2 mounted on it) and the plastic body, generally denoted by 8, is bent at this intermediate stage of its forming process. In particular, the body departs from the ideal shape, with flat top and bottom surfaces, by a degree of depression or elevation, with respect to a plane described by the edges of each of these surfaces, of a plane tangent the corresponding surface in its central region.

This depression (or elevation) is known as warpage, designated W in FIGS. 2 and 3. With a body illustratively measuring about 18–20 mm in width and length and about 1 mm in thickness, as would be typical of current thin packages, warpage my amount to a few tens of microns. Although the amount of warpage deformation is proportionally small compared to the size of the body, still it can grow into a serious problem during the following steps for completing the forming of the device, and does lower the reliability of the finished device.

After removing the packages from the mold, according to the prior art, the individual packages are separated from one another (the so-called singulation step) by cutting up the metal strip on which the batch of leadframes has been formed. Thereafter, for each package, that portion of the leads which has been allowed to protrude out of the package body is bent to create pins (the so-called lead forming step) that will enable the electric connection of the device for a particular application, usually by welding the pins to a printed circuit.

During both of these operations, and as shown schematically in FIG. 4, the plastic body 8 of the package is held between a bottom clamping surface 9 and a top clamping surface 10. Also, its position is set such that it is centered between side retaining means, not shown in FIG. 4. The effective clamping distance H, in practice the gap between the two clamping surfaces 9 and 10, must be preset in the equipment used for these manufacturing steps. To take account of the actual shape of the body, and ensure proper clamping thereof, the distance H is set for an average amount of bending deformation in a package. This is calculated as the sum of the ideal (i.e., undeformed) height of the body—as determined by the thickness of the mold cavity—plus the average deformation thereof. Indicated by arrows in FIG. 4 are the forces F which are applied to the package, specifically at the points of contact between the plastic body 8 and the clamping surfaces 9 and 10.

Despite the equipment having been preset, problems may be encountered during these final steps of the device forming process. In the instance of packages which exit the mold in a markedly bent state, or, at any rate, with an above-average amount of curvature, the unevenly distributed stresses to which the body would be subjected (as shown in FIG. 4 by the arrows F) are quite large, and the package would receive an appreciable bending moment.

Accordingly, there exists a risk of straining the structure of the package or, in the extreme, of breaking the semiconductor die or starting a delamination between internal parts of the body, i.e. of the semiconductor die parting from the leadframe. On the other hand, a slightly deformed—less than a predetermined average amount—package cannot be held securely between the clamping surfaces nor correctly centered.

The likely outcome of this are processing difficulties and/or poor results, which would result in an increased number of rejections. As regards the structural and functional characteristics of the finished device, and hence its reliability, a heavy warpage deformation can result in failure to meet the specifications for a particular application of the device. Major factors in the context of this invention are the overall height of the device (as measured to the outside of pins and plastic body), and the so-called standoff, that is the relative height of the lowermost point on the body and of a plane described by the pin base.

FIGS. 5 and 6 show two prior art devices upon completion of their forming process. The device of FIG. 5 has been obtained by bending the pins 1a and 1b to opposite directions with respect to the bending undergone by the body 8. In the ideal instance of a body developing no deformation, the device standoff would be exactly equal to the constant relative height of the flat bottom surface of the body above a rest plane described by the pin base.

The introduction of warpage diminishes, as shown in FIG. 5, the actual standoff value, denoted by S, with respect to the ideal value, denoted by $S_{ideale}$. In fact, the central region of the bottom surface 11 of the plastic body 8 is sunk with respect to the edges, due to the bending deformation. FIG. 5 illustrates an extreme case where this central region is also sunk with respect to the pin base. In all cases, the pins may fail to adhere tightly to the surface on which the package rests. A typical amount of standoff would be in the range of 0.1 (0.05 mm. Thus, the admissible error may be approximately the same magnitude as the warpage deformation.

The amount of standoff may prove inadequate to ensure electric contact of the device with a printed circuit upon welding, or in any case, may be less than a minimum provided for by its specifications.

FIG. 6 shows a package wherein the pins have been bent in the same direction as the curvature of the body. Here, the effect of the body warpage deformation is that of increasing the overall height of the device. Since in this instance the top surface 12 of the body 8 is bent, with a raised central region, the overall height of the device, as denoted by T in FIG. 6, is given by the ideal overall height of the device, denoted by $T_{ideale}$ in the same Figure, plus the amount of warpage W.

As shown, the ideal overall height $T_{ideale}$ can be obtained as the sum of the constant ideal thickness B of the plastic body 8 plus the amount of standoff $S_{ideale}$, which in this case can be considered to be substantially the same as the actual standoff. Where the effect of the deformation is particularly evident, the packages may deviate from the specifications set for the device application, thereby increasing the rate of production rejections.

SUMMARY OF THE INVENTION

A first object of this invention is to provide a package for integrated circuits which has improved structural features. A closely related object is to reduce the number of rejections at the reliability testing stage. A first particular object is to make the amount of standoff in the finished device independent of the bending deformation in the plastic body.

A second particular object is to make the device overall height value controllable and repeatable. A further object of this invention is to improve those functional characteristics of the package which can enhance its reliability, by improving control of the problems which arise during the device forming process. Particularly during the process steps which follow the body molding, this invention is aimed at improving the plastic body clamping and, therefore, its centering, with consequent improved accuracy of its manufacturing process.

The invention is also aimed at reducing the risk of breaking the semiconductor die, or of delamination problems inside the body. A related object is to provide devices wherein the vertical overall dimension of the body is repeatable and within the ideal thickness value.

Still another object of this invention is to provide a simple process for forming the body which can yield a package of controllable shape and conforming with the specifications set for its application.

The solution which this invention incorporates is that the deformation that the body is bound to undergo, at least in part in an uncontrollable way due to thermal stressing during its formation, specifically during the molding step, can be compensated for by making preliminary changes to the shape of the plastic body predetermined for the molding. In particular, outward bendings which would result in the body exceeding its ideal overall dimensions, must be compensated for. In practice, a mold is used whose cavity shape deviates from the ideal by a deformation which is equal to and oppositely directed from the maximum deformation anticipated for a body, so that a deformed body is released from the molding step which extends in no directions beyond the shape of an ideal body.

The features and advantages of a device obtained by this invention will be more clearly apparent from the description of an embodiment thereof, given by way of non-limitative example with reference to the accompanying drawings.

BRIEF DESCRIPTION OF THE DRAWINGS

FIG. 1 is an exploded sectional view of a prior art mold for forming a plastic package for an integrated circuit, shown during the body molding step.

FIGS. 2 and 3 are sectional views of a prior art plastic package, shown upon exiting the mold and having concavities upwards and downwards, respectively.

FIG. 4 is a sectional view showing the forces which act on a plastic package of conventional construction during the device formation steps which follow the molding step.

FIGS. 5 and 6 are sectional views of a finished prior art device with its pins respectively bent to the same direction as and the opposite direction from the bending undergone by the body.

DETAILED DESCRIPTION OF THE PREFERRED EMBODIMENT

FIGS. 7–13, to be described herein below, are sectional views, not drawn to scale, taken along either of the large dimensions of the package. The curvatures of the perimeter walls delimiting the mold cavity for forming the plastic body and the deformations undergone by the device have been exaggerated for clarity of illustration. This description will cover one embodiment of this invention.

Figure 7:
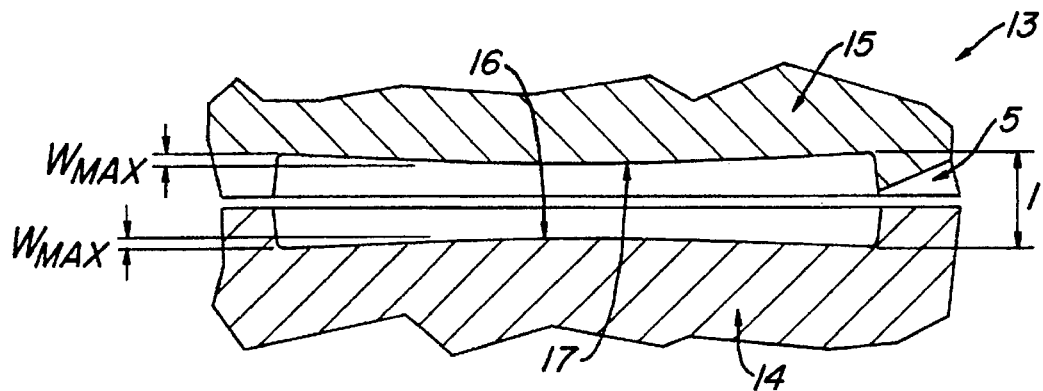
FIG. 7 is a sectional view of a mold for forming a plastic package, according to the invention.

With reference in particular to FIG. 7, generally shown at 13 is a mold for injecting an electrically insulating material. Only one cavity of the mold for forming a single device will be described. Actually, a number of such devices would be formed simultaneously, as previously described in connection with the prior art.

In a preferred embodiment of this invention, the mold is conventionally made up of two superimposable half-shells, or half-molds, namely a lower half-mold 14 and upper half-mold 15, each with a corresponding hollow. The two half-molds 14 and 15 are superposed and delimit a cavity on their interiors which is communicated to an inlet port 5 for the molten material. This inlet port 5 is shown to be formed in the upper half-mold 15, similar to the example described in connection with the prior art. In a practical embodiment, the inlet port 5 could be formed in the lower half-mold 14 or in both half-molds, 14 and 15.

According to this invention, the large delimiting walls of the cavity, that is the bottom wall (inside the lower half-mold 14) and the top wall (inside the upper half-mold 15) denoted by 16 and 17, respectively, are not flat. They are rather given a curvature, with concavities facing in opposite directions, respectively upwards and downwards. Thus, if a device could be ideally produced which underwent no deformation during its formation steps, then the large outward surfaces of the plastic body would be bent inwardly.

In either case, and regardless of the deformation actually undergone by the package, the thickness of the resultant body is unevenly distributed, being smaller in the central region than in the regions near the edges. The amount of the curvature, preset for the walls 16 and 17 delimiting the cavity, is selected to compensate for the effect of warpage, already discussed in connection with the prior art, on the body and especially on the surface being bent outwardly.

That is, the amount of said curvature is equal to the maximum curvature anticipated for the body under deforming stress in one direction or the opposite one (concavity upwards or downwards in FIGS. 2 and 3). What will be delivered from the inventive mold is, therefore, a plastic body having a predictable vertical overall dimension which is unaffected by any deformation undergone by an individual package, this vertical overall dimension being equal to the distance between the mold surfaces 16 and 17 along the edges. This vertical overall dimension is denoted by I in FIG. 7.

The absolute value of the curvature is, in the embodiment shown, approximately the same for both walls 16 and 17, such being approximately also the effect of the thermal bending deformation on the corresponding surfaces of the formed body. In FIG. 7, the elevation and depression, respectively, in the central region of the bottom wall 16 and the top wall 17 with respect to a plane described by the edges of the corresponding surface is denoted by $W_{MAX}$. This is the maximum amount of warpage to which the body is subjected.

A typical preferred value for $W_{MAX}$ is 40 µm (micrometers) for a plastic material having a shrinkage coefficient of 17 E-6/°C. and for packages of the TSOP (Thin Small Outline Package) type, measuring 18–20 mm in length and width and having an average thickness of 1 mm or less, in accordance with the latest developments in the art. Statistical analysis procedures are used to determine the maximum warpage $W_{MAX}$. The manufacturing steps for a device with a plastic body, according to this invention, and the device itself as it appears at different stages of its formation, are illustrated by FIGS. 8–13.

Throughout these Figures, and similar to the foregoing considerations made about the prior art, the numeral 1 denotes a metal leadframe, usually a worked foil provided with terminal leads and having a semiconductor die 2 mounted thereon, usually in a sunk central region of the leadframe, which has been formed with an integrated circuit. The integrated circuit, as usual in the art, is in electric contact with the leadframe, or more precisely, electrically connected to the leads by means of thin metal wires.

Figure 8:
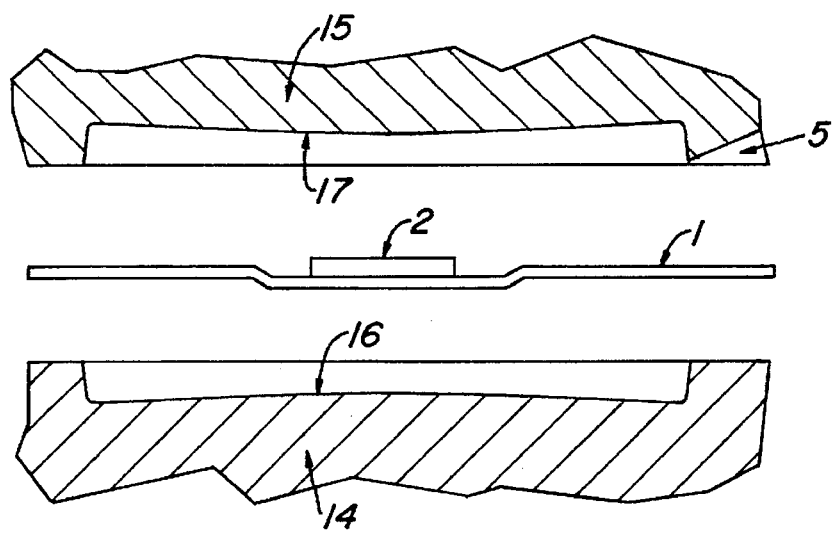
FIG. 8 is an exploded sectional view of a mold for forming a plastic package for an integrated circuit, according to this invention, shown at the body molding step.

As shown in FIG. 8, the leadframe 1 is placed between the two half-molds 14 and 15. Specifically, the leadframe 1 and the die 2 mounted thereon are placed into the hollow formed in the lower half-mold 14, and the lead ends are laid onto the half-mold 14 outside the hollow. The integrated circuit 2, in particular, is centered in the hollow. The upper half-mold 15 is then superimposed, with its hollow aligned to mate with the hollow formed in the lower half-mold 14, thereby defining a cavity between the two half-shells 14 and 15. After clamping the two half-molds 14 and 15, the plastic body forming operation is started.

Figure 9:
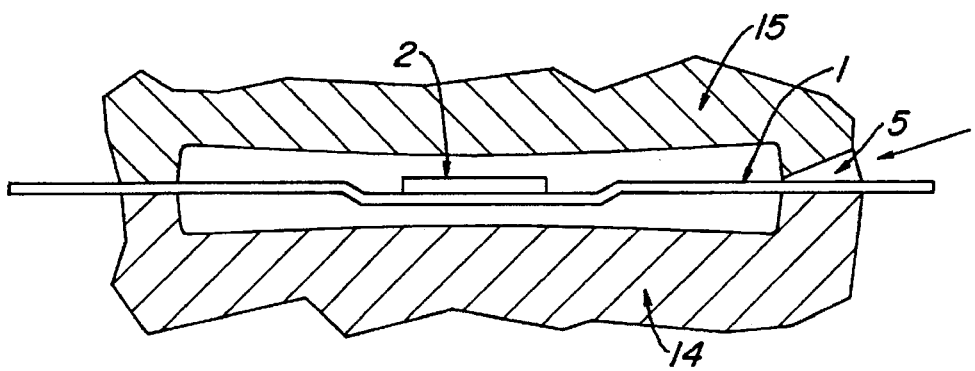
FIG. 9 is a sectional view illustrating the step of injecting the plastic material into the mold, in accordance with this invention.

As shown in FIG. 9, a plastic molten material at a high temperature, e.g. an epoxy resin, is injected under pressure into the cavity so obtained through specially arranged channels, not shown, and the inlet port 5. This is followed by different thermodynamic cooling and resin curing processes, already described in connection with the prior art. During the steps just discussed, due to thermal stressing, the body generally undergoes a bending deformation or warpage, similar to a conventional plastic package.

According to this invention, however, the warpage effect on the shape of the body actually produced is fully compensated for by the different shape of the mold cavity employed. The warpage yields a body which has one of its large outward surfaces approximately flat and the other surface with a double curvature compared to that produced by warpage in a standard package.

Figure 10:
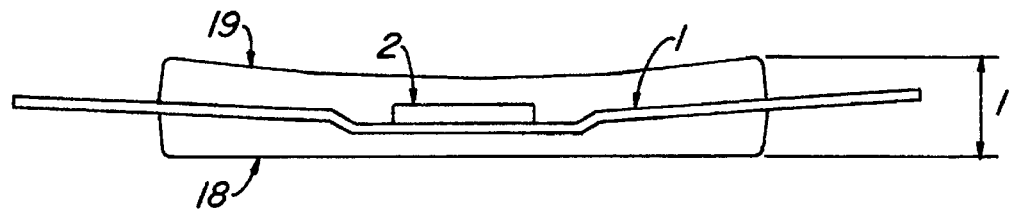
FIGS. 10 and 11 are sectional views showing a plastic package as it exits the mold with concavities upwards and downwards, respectively, in accordance with this invention.
Figure 11:
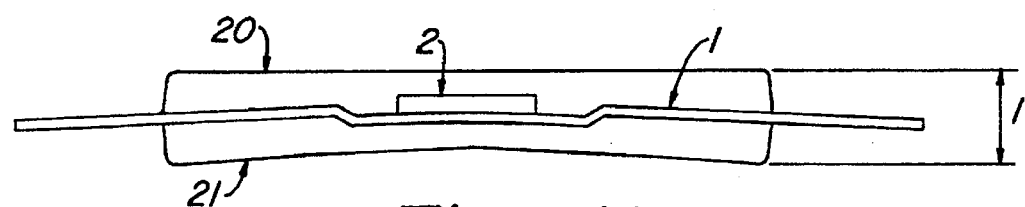

In particular, FIGS. 10 and 11 are sectional views showing schematically a package at room temperature, as it appears after thorough cooling upon exiting the mold.

Shown in FIG. 10 is a package which underwent deformation similar to FIG. 2, that is with a concavity upwards. Schematically shown is, in particular, a package which has been warped to a maximum extent. As can be seen, the bottom surface 18 of the package is flat because the warping action produces an oppositely directed curvature with respect to the compensating curvature built in the corresponding delimiting wall of the mold cavity (wall 16 in FIGS. 7–8), and is fully compensated for.

The top surface 19 has instead a double inward curvature because the bending due to warpage adds to that imparted by the mold. Of course, in those packages which have been warped to less than the maximum value that has been taken into account in setting the mold wall surfaces, the bottom surface 18 will not be truly flat, and will bend more or less inward of the body. On the other hand, the top surface 19 may develop a smaller curvature than the maximum shown in FIG. 10.

FIG. 11 illustrates instead the behavior of a package which, according to the prior art, would develop its maximum concavity downwards. In this case, the substantially flat outward surface is the upper surface 20, while the bottom surface 21 has twice the curvature of a conventional package. The fact that the device according to the invention may show twice the amount of curvature on an outward surface thereof represents no problem for the following step, but rather avoids the problems discussed in connection with the current technique.

The bending of all the large surfaces of the body in the inventive device always occurs, in fact, along the inward direction of the body. It can be seen in both FIGS. 10 and 11 that, whatever the amount of warpage developed, the body will never exceed, either downwardly or upwardly, a vertical overall dimension denoted by I which corresponds to the greatest thickness of the body near its edges. This vertical dimension can be preset from the dimensions of the mold cavity employed, and is in particular equal to the distance (distance I in FIG. 7) between the wall surfaces 16 and 17 of the mold at the edges.

The distance I may be used to advantage for setting the equipment used in the subsequent forming steps of the device. In the subsequent completion steps of the device forming operation, according to the prior art described hereinabove and schematically shown in FIG. 4 by way of example, the package is placed in equipment having package clamping surfaces for separating the individual devices and bending the pins.

The distance H between the clamping surfaces, to be set before the packages are introduced, for a package according to the invention, as shown in FIGS. 10 and 11 by way of example, is related non-critically to the bending deformation of the individual package. This distance can be advantageously selected to be equal to the vertical overall dimension I. The edges of both the bottom and top surfaces (18 and 19 in FIG. 10; 21 and 20 in FIG. 11) of the body constitute contact points regardless of the amount of warpage deformation. And after all, there are no other central points of contact. Thus, the package will be properly clamped between these points.

In this way, problems from an undefined setting value are avoided with the equipment, and the risk is avoided of straining the structure, while the package alignment is improved.

This solution according to the invention offers, therefore, the advantages of facilitating the following manufacturing steps and improving the characteristics of the device.

Figure 12:
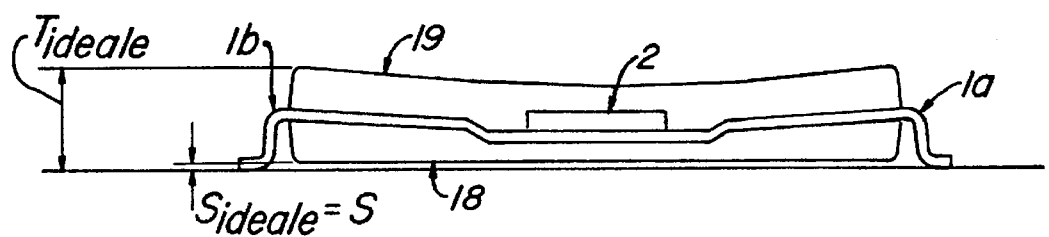
FIGS. 12 and 13 are sectional views of a finished device according to the invention, having its pins respectively bent to the same direction as and the opposite direction from the bending undergone by the body.
Figure 13:
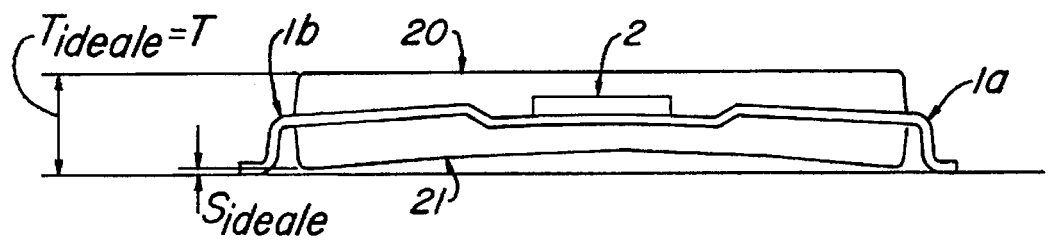

FIGS. 12 and 13 show two typical devices at the end of the manufacturing process according to the invention, for two different forming methods. In both cases, the standoff and overall height of the device are controllable quantities.

In FIG. 12, the pins 1a and 1b have been bent to the opposite direction from the bending of the body. In particular, the most common result of a standard formation, that is with the die 2 in an upward position relative to its leadframe 1, is shown for a package which, on exiting the mold, has its concavity upwards as shown in FIG. 10.

Of course, the same considerations would apply to a reversely formed package, that is with the die 2 under the leadframe 1, and to a body having its concavity downwards as in FIG. 11. As can be seen, inasmuch as the bottom surface 18 of the plastic body is flat or at least not downward bent, the central region is no longer sunk from a plane described by the edges. This means that the minimum standoff is constant, equal to the ideal $S_{ideale}$, and hence unrelated to the deformation.

The standoff can be selected as an operational parameter included to the applicational specifications of the device. A device with pins (1a and 1b) bent to the same direction as the curvature undergone by the body is shown in section in FIG. 13, specifically for reverse forming with the concavity upwards.

In the same way as described in relation to FIG. 12, this would be equivalent to considering a package formed in a standard way but showing a concavity downwards as released from the mold. In this case, the parameter which caused problems to prior art devices was the overall height of the device T. Here as can be gathered from FIG. 13, inasmuch as the top surface 20 is flat, the central region of the surface is no longer raised above a plane described by the edges. The overall height is, therefore, equal to the ideal $T_{ideale}$, and can be obtained as the sum of the overall dimension of the plastic body (not specified in FIG. 13) plus the standoff $S_{ideale}$, and is hence unaffected by warpage deformation.

This invention has the advantage of providing packages with improved reliability. It provides a smaller number of packages out of specifications and accordingly, a reduced statistical number of rejections during testing of the finished device. The solution proposed allows the negative effects of warpage deformation on the device characteristics to be controlled and removed.

In particular, it is now possible to control the values of the standoff and the overall height so as to keep them within specifications. The optimized standoff has the advantage of yielding devices which have improved electric contact (better welding) with the package rest surface.

The solution provided by this invention has a further advantage in that it makes for improved repeatability of the device forming processes through the control of the package characteristics. This leads to decreased rejections from production and, hence, to savings in costs.

The manufacturing steps subsequent to the formation of the body, according to this invention, are facilitated, particularly because package clamping and centering problems are eliminated by the possibility of accurately determining the maximum overall dimension of the body. Greatly reduced is also the risk of breaking the package from mechanical straining, inasmuch as the body has no surfaces bent along the outward direction.

In addition, this invention allows a package to be formed with improved characteristics using a simple process. While only one embodiment of this invention has been described and illustrated, many modifications and variations are possible consistent with the basic concept of the invention as set forth in the appended claims. For .example, it is not necessary for the mold to be comprised of upper and lower half-molds, but there could be a different mold construction. Correspondingly therewith, some other forming technologies could be used. The delimiting walls of the mold cavity could show some irregularities, while still providing an envelope substantially in the form of a spherical segment. It would also be possible to provide a mold wherein only one of the large delimiting walls of the cavity is given a curvature.

Furthermore, the overall shape of the package, illustrated herein in schematic form, encompasses different types of packages, and changes may be made thereunto within the scope of the present inventive idea.

I claim:

1. A method for forming a thin plastic package for an integrated electronic semiconductor device to be encapsulated within a plastic body, comprising the step of
molding said plastic body, using a molding cavity, so as to fully enclose a semiconductor element on which an integrated electronic circuit has been formed and which is placed onto a metal leadframe electrically connected to said integrated electronic circuit and having a plurality of terminal leads extending outwards from said plastic body for external electrical connection;
wherein said molding cavity delimited by perimeter walls, including side walls, defining a concave-shape volume having a maximum height at the sidewalls, wherein the concave-shape volume shape compensates for any outward bending from said volume undergone by corresponding surfaces of said plastic body during the molding step.

2. A method according to claim 1, wherein said mold cavity is delimited by two walls, a bottom wall and a top wall, of which at least one of the two walls has a curvature directed inwardly of said molding cavity toward the lead frame.

3. A method according to claim 2, wherein the curvature of said at least one of the two walls is equal to the maximum outward curvature undergone by the corresponding surface of said plastic body during the molding step.

4. A method according to claim 2, wherein both said bottom top walls have respective curvatures.

5. A method according to claim 4, wherein said curvatures are equal.

6. A method according to claim 2, wherein the ratio between length and average thickness of the volume defined by the perimeter walls is in a range of approximately 20.

7. A method according to claim 2, wherein the volume defined by the perimeter walls includes corners defined by the perimeter walls and wherein the length of the volume defined by the perimeter walls is approximately 20 mm, its thickness is approximately 1 mm and the difference between the thickness of a central part and of a part proximal to the corners is about 40 µm.

8. A method for improving the reliability of a thin plastic package for an integrated electronic semiconductor device to be encapsulated in a plastic body formed by molding, comprising the steps of:
arranging inside a lower cavity formed in a lower half-mold, a metal leadframe on which a semiconductor element is placed, wherein an integrated electronic circuit has been formed on said semiconductor element and is electrically connected to said metal leadframe, so as to leave outside of said lower cavity a plurality of terminal leads formed on said metal leadframe for external electric connection;
positioning, over said lower half-mold, an upper half-mold having an upper cavity opposite to said lower cavity to form a single cavity which encloses said semiconductor element and part of said metal leadframe; and
injecting a resin into the cavity formed by the lower and the upper half-mold to fully enclose the semiconductor element;
wherein at least one of said lower and upper half-molds has a perimeter wall delimiting the corresponding cavity and having a curvature directed inwardly of said cavity such that said perimeter wall compensates for any outward bending of said plastic body during said injecting step.

9. A method according to claim 8, wherein the curvature of said perimeter wall is equal to the maximum outward curvature undergone with respect to said wall by the corresponding surface of the plastic body during the molding step.

10. A method according to claim 8, wherein a bottom wall of said lower cavity and a top wall of said upper cavity have respective curvatures.

11. A method according to claim 10, wherein said curvatures are equal.

12. A method according to claim 8, wherein the ratio between length and average thickness of the volume occupied by the cavity is in a range of approximately 20.

13. A method according to claim 8, wherein the cavity includes corners and wherein the length of the cavity is approximately 20 mm, its thickness is approximately 1 mm and the difference between the thickness of a central part and of a part proximal to the corners is about 40 µm.

* * * * *